(12) United States Patent
Anderson et al.

(10) Patent No.: US 8,518,817 B2
(45) Date of Patent: Aug. 27, 2013

(54) METHOD OF ELECTROLYTIC PLATING AND SEMICONDUCTOR DEVICE FABRICATION

(75) Inventors: Felix P. Anderson, Colchester, VT (US); Zhong-Xiang He, Essex Junction, VT (US); Anthony K. Stamper, Williston, VT (US); Eric J. White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/887,737

(22) Filed: Sep. 22, 2010

(65) Prior Publication Data
US 2012/0070979 A1   Mar. 22, 2012

(51) Int. Cl.
*H01L 21/4763* (2006.01)
(52) U.S. Cl.
USPC ........... 438/626; 438/631; 438/672; 438/678; 257/E21.495
(58) Field of Classification Search
USPC .................. 438/626, 672, 678; 257/E21.495
See application file for complete search history.

(56) References Cited

U.S. PATENT DOCUMENTS

| | | | |
|---|---|---|---|
| 6,008,119 A | 12/1999 | Fournier | |
| 6,344,408 B1 | 2/2002 | Chen et al. | |
| 6,355,147 B1 | 3/2002 | Griffiths et al. | |
| 6,420,258 B1 * | 7/2002 | Chen et al. | 438/622 |
| 6,432,825 B1 | 8/2002 | Torii | |
| 6,773,570 B2 | 8/2004 | Economikos et al. | |
| 7,384,530 B2 | 6/2008 | Cohen et al. | |
| 2003/0080432 A1 * | 5/2003 | Higashi et al. | 257/758 |
| 2003/0146102 A1 * | 8/2003 | Ramanathan et al. | 205/291 |
| 2004/0094403 A1 * | 5/2004 | Economikos et al. | 204/212 |
| 2004/0094427 A1 * | 5/2004 | Economikos et al. | 205/223 |
| 2004/0197541 A1 | 10/2004 | Zahka et al. | |
| 2005/0167780 A1 * | 8/2005 | Edelstein et al. | 257/531 |
| 2006/0033678 A1 * | 2/2006 | Lubomirsky et al. | 345/32 |
| 2007/0111519 A1 * | 5/2007 | Lubomirsky et al. | 438/678 |
| 2008/0102628 A1 * | 5/2008 | Hasunuma et al. | 438/660 |
| 2009/0277867 A1 * | 11/2009 | Mayer et al. | 216/13 |
| 2009/0283413 A1 | 11/2009 | Sato | |

FOREIGN PATENT DOCUMENTS

JP    04041698 A  *  2/1992

OTHER PUBLICATIONS

Yu et al., "Field Effect in "Overplating" Above Damascene Trench Clusters," 2004, 1 page, Abs. 168, 205th Meeting of the Electrochemical Society.
Tugbawa et al., "Integrated Chip-Scale Simulation of Pattern Dependencies in Copper Electroplating and Copper Chemical Mechanical Polishing Processes," 2002, 3 pages, Int. Intercon Tech Conference.
Krishnan et al., "Chemical Mechanical Planarization: Slurry Chemistry, Materials, and Mechanisms,"2010, pp. 178-204, Chem. Rev 2010, 110. Publication Date (Web): Nov. 23, 2009.

* cited by examiner

*Primary Examiner* — Jarrett Stark
(74) *Attorney, Agent, or Firm* — Richard M. Kotulak; Hoffman Warnick LLC

(57) ABSTRACT

The disclosure relates generally to semiconductor device fabrication, and more particularly to methods of electroplating used in semiconductor device fabrication. A method of electroplating includes: immersing an in-process substrate into an electrolytic plating solution to form a first metal layer on the in-process substrate; then performing a first chemical-mechanical polish to a liner on the in-process substrate followed by immersing the in-process substrate into the electrolytic plating solution to form a second metal layer on the first metal layer and the liner; and performing a second chemical-mechanical polish to the liner.

25 Claims, 12 Drawing Sheets

METHOD OF ELECTROLYTIC PLATING AND SEMICONDUCTOR DEVICE FABRICATION

BACKGROUND

1. Technical Field

The disclosure relates generally to semiconductor device fabrication, and more particularly, to methods of electrolytic plating used in semiconductor device fabrication.

2. Background Art

Typical semiconductor integrated circuit (IC) devices, and particularly, ultrafine semiconductor IC devices, include a multilayer wiring structure having patterns comprising a low resistance material employed to interconnect numerous discrete semiconductor devices formed on a substrate. Often, for multilayer wiring structures having copper wiring patterns, fabrication involves wiring trenches or vias formed in advance within a silicon oxide film or within an interlayer dielectric film made of a low-permittivity (low-k) material. The wiring trenches or vias are then filled with a metal layer such as copper and any excess metal is removed by chemical-mechanical polishing.

SUMMARY

An aspect of the present invention relates to a method of electrolytic plating comprising: immersing an in-process substrate into an electrolytic plating solution to form a first metal layer on the in-process substrate; performing a first chemical-mechanical polish to a liner on the in-process substrate; immersing the in-process substrate into the electroplating solution to form a second metal layer on the first metal layer and the liner; and performing a second chemical-mechanical polish to the liner.

A second aspect of the present invention relates to a method of fabricating a semiconductor device comprising: conformally coating a trench within a dielectric layer disposed on a substrate with a liner and a metal seed layer; immersing the substrate into an electrolytic plating solution to form a first metal layer on the substrate; performing a first chemical-mechanical polish to the liner; immersing the substrate into the electrolytic plating solution to form a second metal layer on the first metal layer and the liner; and performing a second chemical-mechanical polish to the liner.

A third aspect of the present invention relates a method of electrolytic plating comprising: immersing an in-process substrate into an electrolytic plating solution to form a metal layer on the in-process substrate; and performing a chemical-mechanical polish to a liner on the in-process substrate; wherein the immersing includes rotating the in-process substrate in a first direction and then rotating in a second direction.

A fourth aspect of the present invention relates to a method of fabricating a semiconductor device comprising: conformally coating a trench within a dielectric layer disposed on a substrate with a liner and a metal seed layer; immersing the substrate into an electrolytic plating solution to form a metal layer on the substrate; and performing a chemical-mechanical polish to the liner; wherein the immersing includes, rotating the substrate in a first direction and then rotating in a second direction.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

It has been discovered that in semiconductor device fabrication, electrolytic plating of deep linear features, for example, multiple consecutive trenches, nested elbows, and other large repeating features with depths greater than 2 micrometers (μm), is a challenging process. Deep features can affect local fluid flow of an electrolytic plating solution and result in formation of defects in the semiconductor device, e.g., dishing streaks. Dishing streaks are typically a result of a combination of overplating in the field and under planarization in the deep features due to localized underplating resulting from local depletion of the electrolytic plating solution.

Figure 1A:
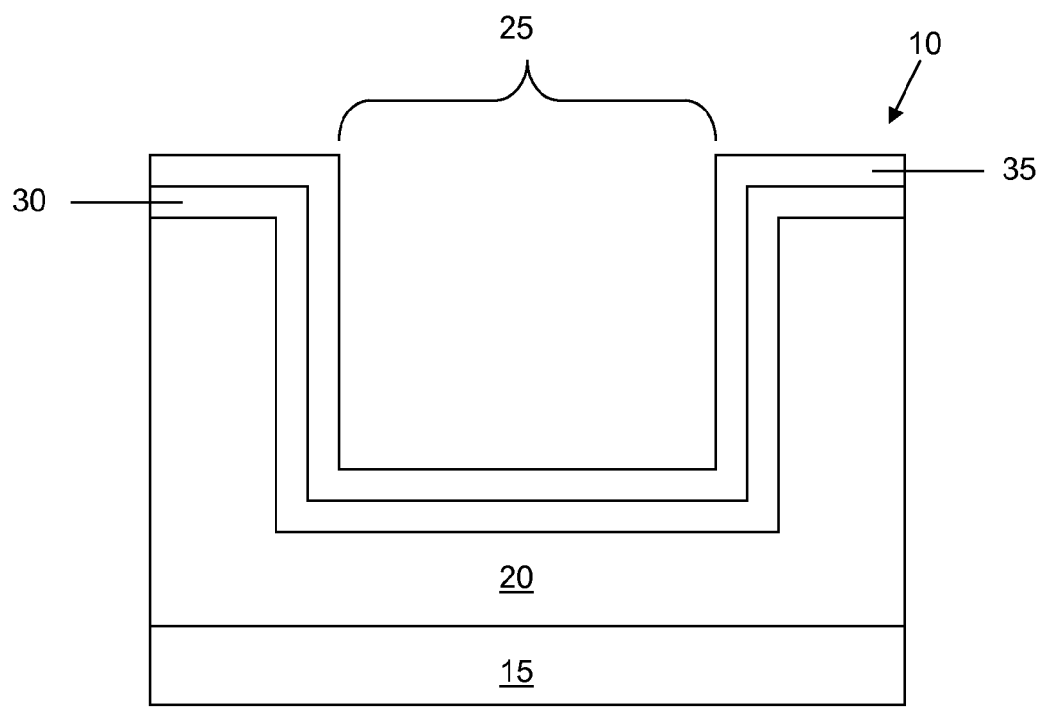
FIG. 1A-1F depicts steps of an embodiment of a method of electrolytic plating, in accordance with the present invention.

An embodiment of steps of a method of electrolytic plating according to the present invention are shown in FIGS. 1A-1F. Referring to FIG. 1A, an in-process substrate 10 is shown. In-process substrate 10 may be but is not limited to a layer in a multilayer wiring structure of a semiconductor device or an integrated circuit, and a patterned semiconductor wafer (either alone or in assemblies comprising other materials thereon).

In an embodiment of the present invention, in-process substrate 10 may be a layer in a multilayer wiring structure including a substrate 15, a layer 20, a trench 25, a liner 30, and a metal seed layer 35. Substrate 15 may comprise silicon, silicon-on-insulator, silicon germanium, or gallium arsenide. Additionally, substrate 15 may be a semiconductor substrate comprising but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Semiconductor substrate 15 may also include Group II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity).

Layer 20 may be a dielectric layer that includes but is not limited to silicon oxide ($SiO_2$), silicon nitride ($Si_3N_4$), hafnium oxide ($HfO_2$), hafnium silicon oxide (HfSiO), hafnium silicon oxynitride (HfSiON), zirconium oxide ($ZrO_2$), zirconium silicon oxide (ZrSiO), zirconium silicon oxynitride (ZrSiON), aluminum oxide ($Al_2O_3$), titanium oxide ($Ti_2O_5$), tantalum oxide ($Ta_2O_5$), hydrogen silsesquioxane polymer (HSQ); methyl silsesquioxane polymer (MSQ); SiLK™ (polyphenylene oligomer) manufactured by Dow Chemical, Midland, Mich.; Black Diamond™ [SiO$_x$(CH$_3$)$_y$] manufactured by Applied Materials, Santa Clara, Calif.; fluorinated tetraethylorthosilicate (FTEOS), fluorinated silicon glass (FSG), spin on glass, and spin on polyimide.

Layer 20 may also comprise multiple dielectric layers, for example, a low-k (dielectric constant) layer and another dielectric layer such as silicon nitride and/or silicon oxide. The second dielectric layer may have a higher k dielectric constant value than the low-k dielectric layer. Low-k dielectric layers include materials having a relative permittivity value of 4 or less, and examples of which include but are not limited to HSQ, MSQ, SiLK™, Black Diamond™, FTEOS, and FSG.

Trench 25 is located within layer 20. Trench 25 is an example of a linear feature within a semiconductor device and in particular, a deep linear feature. Trench 25 and other deep features are known in the art. In an embodiment, trench 25 may have conformal coatings of liner 30 and metal seed layer 35. Liner 30 may include but is not limited to tantalum (Ta), tantalum nitride (TaN), tantalum-aluminum nitride (TaAlN), tantalum silicide (TaSi$_2$), titanium (Ti), titanium nitride (TiN), titanium-silicon nitride (TiSiN), or tungsten nitride (WN). Metal seed layer 35 may include but is not limited to copper, nickel, gold, and/or silver disposed on liner 30. In an embodiment, metal seed layer 35 may comprise copper.

Figure 1B:
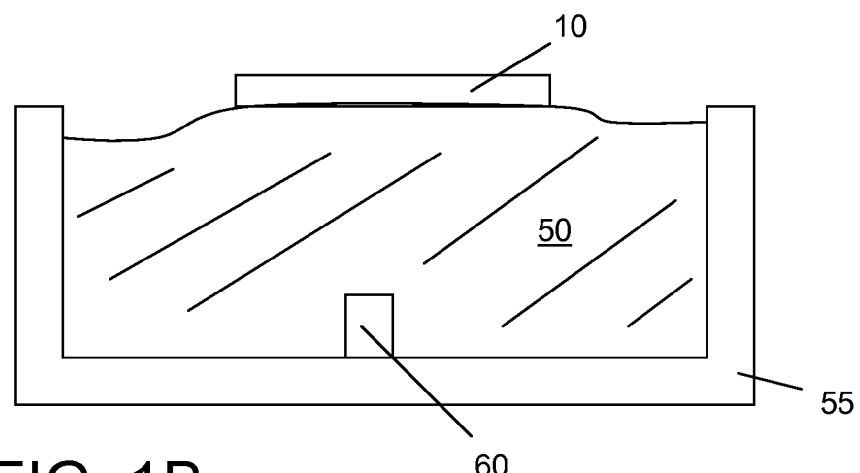
Figure 1C:
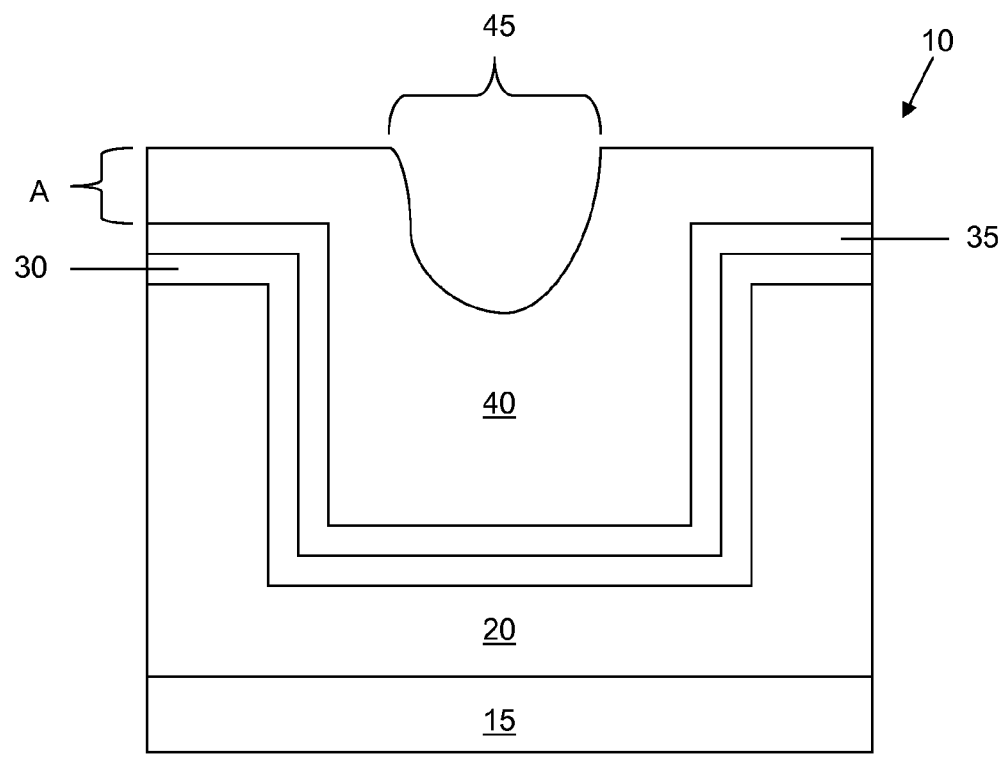

Referring to FIGS. 1B and 1C, in-process substrate 10 may be immersed in an electrolytic plating solution 50. In an embodiment, solution 50 may comprise a copper sulfate solution, a sulfuric acid solution, and a solution of organic additives such as but not limited to accelerators, levelers and suppressors. Organic additives such as accelerators, levelers, suppressors, and others are known in the art. Solution 50 may be contained in a solution container 55 and may be circulated up through a center nozzle 60. Solution 50 may also pass through a diffuser (not shown) after circulating through center nozzle 60. In-process substrate 10 may be lowered face down, e.g., trench 25 is facing solution 50, into solution 50 and rotated at a rate of approximately 30 rpm to approximately 180 rpm. Simultaneously, a current density of approximately 3 mA/cm$^2$ to approximately 60 mA/cm$^2$ may be applied. In an embodiment, a current density of approximately 20 mA/cm$^2$ to approximately 50 mA/cm$^2$ may be applied.

The rotating in-process substrate 10 may be electrically contacted at an edge of in-process substrate 10 resulting in formation of a first metal layer 40 on the surface of in-process substrate 10, in particular on liner 30, and within trench 25. First metal layer 40 forms on liner 30 with the aid of metal seed layer 35 and may entirely fill trench 25. Excess portion A of first metal layer 40 may also form above trench 25 and above liner 30 that is outside of trench 25. Excess portion A may have a thickness, for example, from approximately 5,000 Å to approximately 250,000 Å. A dish streak 45 may be present in first metal layer 40 extending into trench 25 due to localized underplating resulting from local depletion of solution 50 during rotation of in-process substrate 10. First metal layer 40 may include but is not limited to copper, nickel, gold, and silver. In an embodiment, first metal layer 40 may comprise copper. Devices and methods for performing electrolytic plating are known in the art.

Figure 1D:
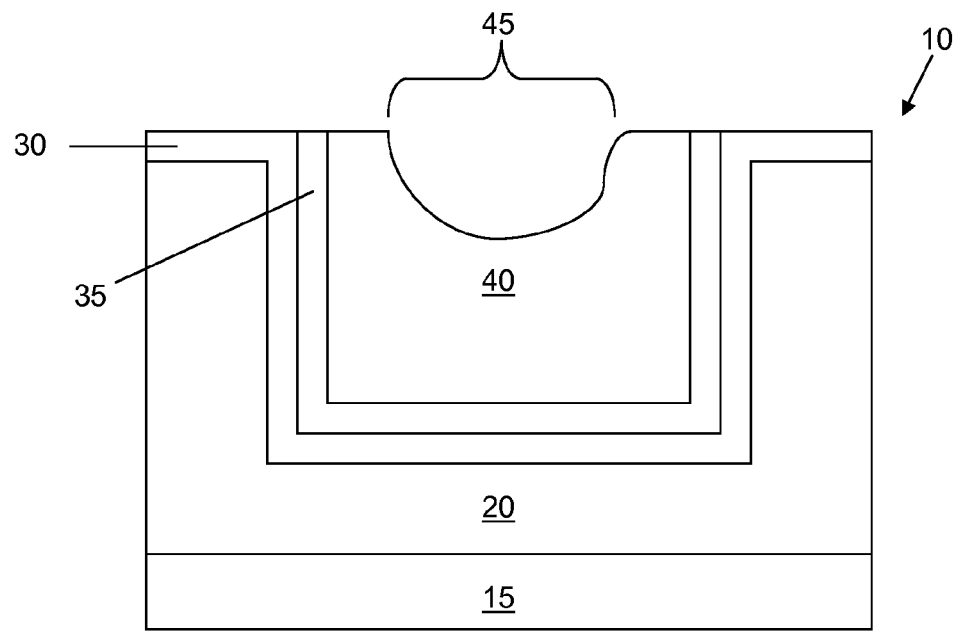

Referring to FIG. 1D, a first chemical-mechanical polishing may be performed to liner 30. First metal layer 40 may be removed down to liner 30 outside of trench 25 and above trench 25 such that first metal layer 40 is level with liner 30 outside of trench 25. The portion of dish streak 45 extending into trench 25 may still be present after chemical-mechanical polishing. Chemical-mechanical polishing is a process known in the art. It has been discovered that performing "touch up" electrolytic plating can be used to remove dish streaking that has resulted from a previously performed electrolytic plating step.

Figure 1E:
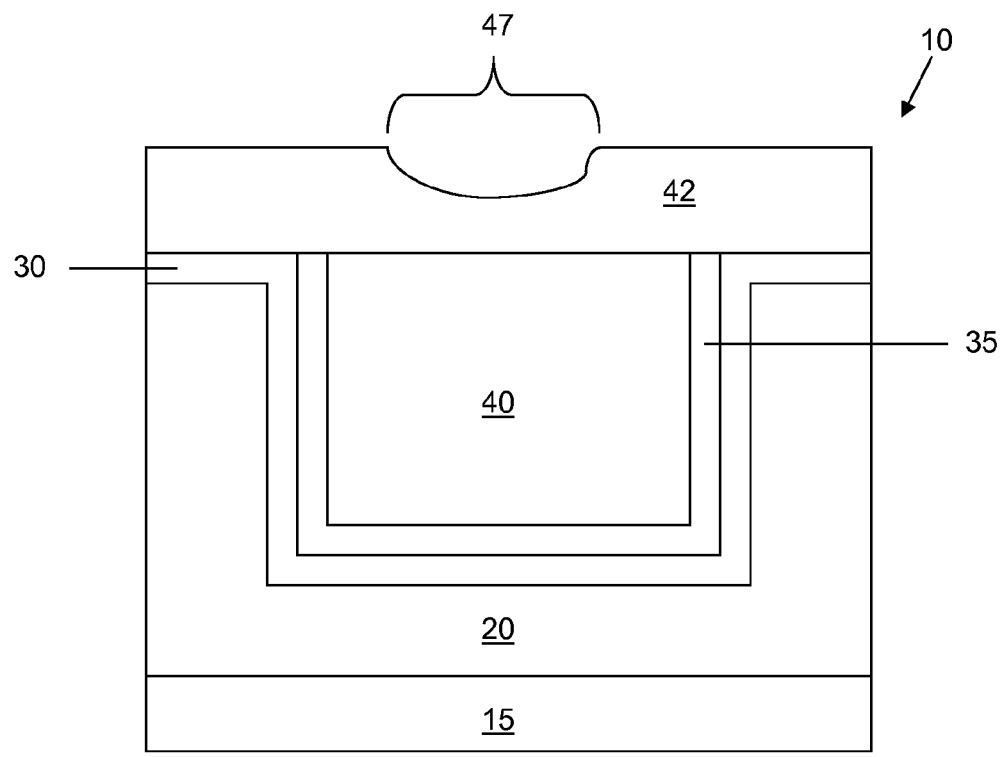

Referring to FIG. 1E, in-process substrate 10 may be immersed again into electrolytic plating solution (not shown) resulting in the formation of a second metal layer 42 on first metal layer 40. The electroplating process for depositing second metal layer 42 is the same as described herein for deposition of first metal layer 40. Second metal layer 42 may include but is not limited to copper, nickel, gold and/or silver. In an embodiment, second metal layer 42 may also comprise copper. Dish streak 45 may be filled with metal layer 42 and thus eliminated, but a dish streak 47 may be formed in second layer 42 again due to localized underplating resulting from local depletion of solution 50 during rotation of in-process substrate 10. Dish streak 47 does not extend into trench 25. The result of the second electrolytic plating is that any defects, such as dish streaking, present in first copper layer 40 may be eliminated by electrolytic plating of second copper layer 42.

Figure 1F:
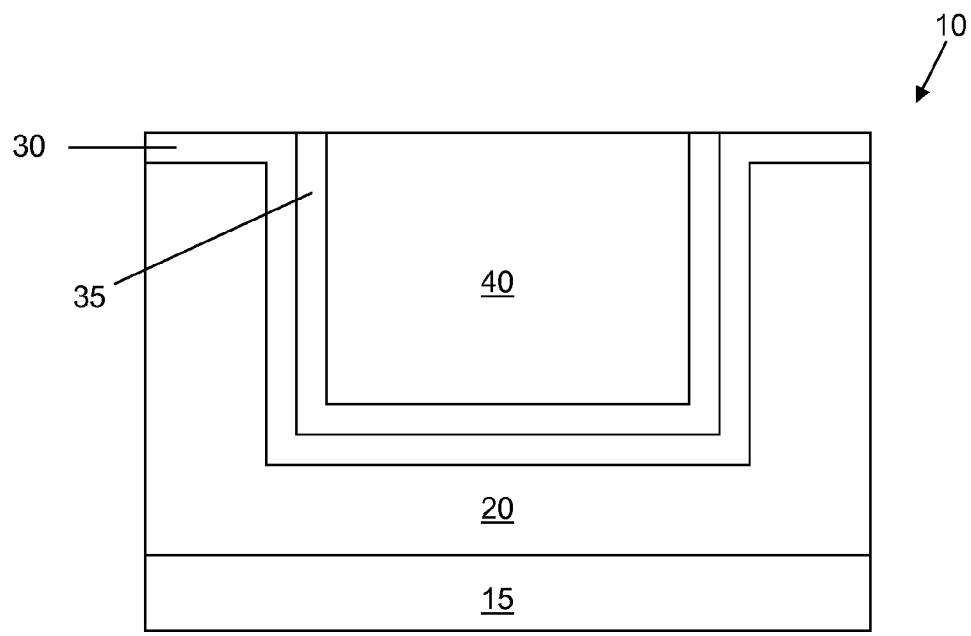

Referring to FIG. 1F, a second chemical-mechanical polishing may be performed to liner 30. Second metal layer 42 may be removed down to liner 30 outside of trench 25 and above trench 25 such that second metal layer 42 is level with liner 30 outside of trench 25. The result is that second metal layer 40 may be removed along with dish streak 47 leaving trench 25 filled with copper having no defects such as a dish streak.

Figure 2A:
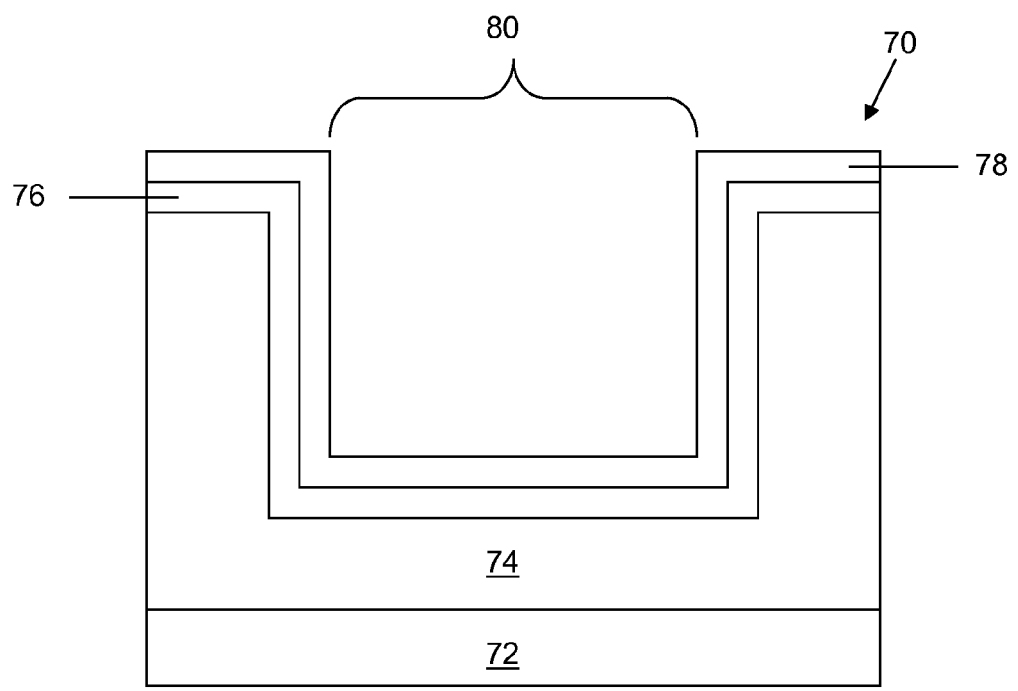
FIG. 2A-2D depicts steps of another embodiment of a method of electrolytic plating, in accordance with the present invention.

An embodiment of steps of another method of electrolytic plating according to the present invention are shown in FIGS. 2A-2D. Referring to FIG. 2A, an in-process substrate 70 is shown. In an embodiment of the present invention, in-process substrate 70 may be a layer in a multilayer wiring structure including a substrate 72, a layer 74, a trench 80, a liner 76, and a metal seed layer 78. Various embodiments of the aforementioned have been described herein.

Figure 2B:
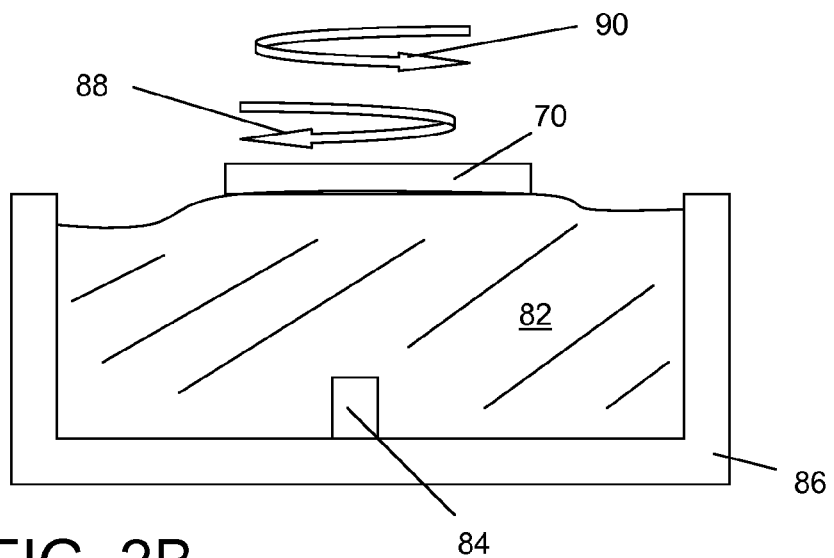
Figure 2C:
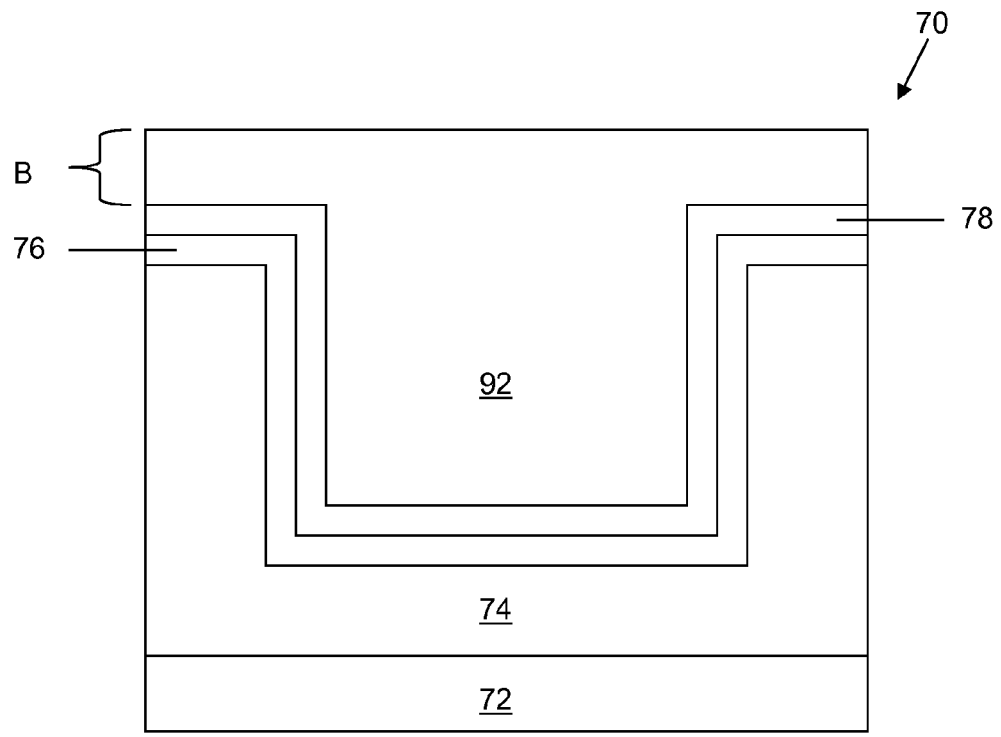

Referring to FIGS. 2B and 2C, in-process substrate 70 may be immersed in an electrolytic plating solution 82. Various embodiments of electrolytic plating solution 82 and the electrolytic plating parameters have been described herein. In-process substrate 70 may be lowered face down, e.g., trench 80 is facing solution 82, into solution 82 and rotated. In an embodiment, in-process substrate 70 may be rotated a rate of approximately 30 rpm to approximately 180 rpm in a direction represented by directional arrow 90 for approximately 1 min to approximately 5 min. Simultaneously with the rotation, a current density of approximately 3 mA/cm$^2$ to approximately 60 mA/cm$^2$ may be applied. In an embodiment, a current density of approximately 20 mA/cm$^2$ to approximately 50 mA/cm$^2$ may be applied.

Then, in-process substrate 70 may be rotated at a rate of approximately 30 rpm to approximately 180 rpm in the opposite direction represented by directional arrow 88 for approximately 5 min to approximately 20 min. Simultaneously with the rotation, a current density of approximately 3 mA/cm$^2$ to approximately 60 mA/cm$^2$ may be applied. In an embodiment, a current density of approximately 20 mA/cm$^2$ to approximately 50 mA/cm$^2$ may be applied. Embodiments of the present invention include directional arrow 90 representing a counter-clockwise direction and directional arrow 88 representing a clockwise direction. Rotation may be made using any now known solution; e.g., a motor.

The rotating in-process substrate 70 may be electrically contacted at an edge of in-process substrate 70 resulting in formation of a metal layer 92 on the surface of in-process substrate 70, in particular on liner 76, and within trench 80. Metal layer 92 forms on liner 76 with the aid of metal seed layer 78 and may entirely fill trench 80. Excess portion B of metal layer 92 may also form above trench 80 and above liner 76 that is outside of trench 80. Excess portion B may have a thickness, for example, from approximately 5,000 Å to approximately 250,000 Å. Metal layer 92 may include but is not limited to copper, nickel, gold, and/or silver. In an embodiment, metal layer 92 may comprise copper. No defects such as dish streaking are found in metal layer 92 as underplating does not occur because the rotation of in-process substrate 70 in opposite directions prevents depletion of solution 82 during the electrolytic plating process.

Figure 2D:
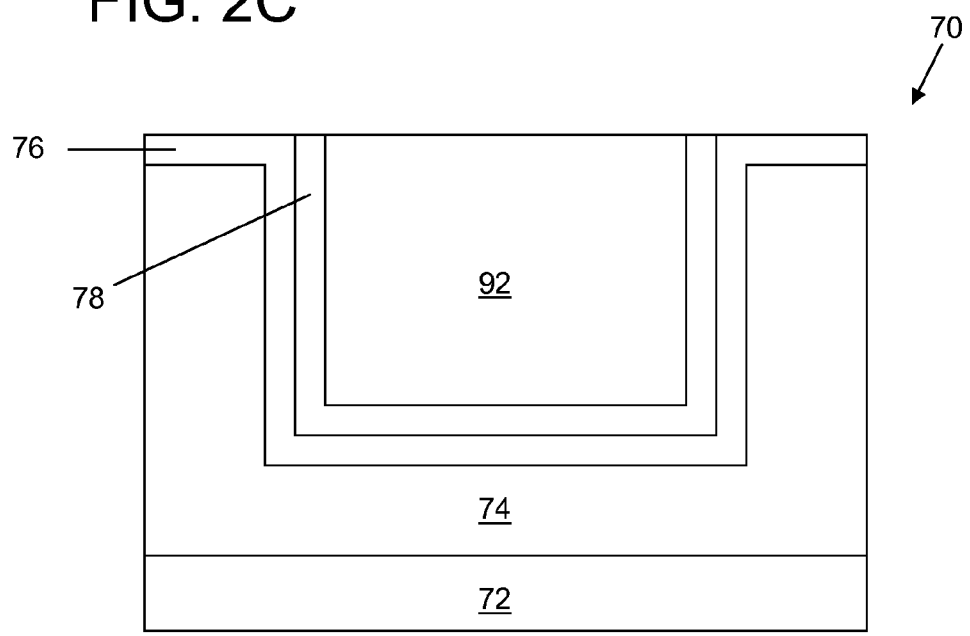

Referring to FIG. 2D, chemical-mechanical polishing may be performed to liner 76. Metal layer 92 may be removed down to liner 76 outside of trench 80 and above trench 80 such that metal layer 92 is level with liner 76 outside of trench 80. The result is that trench 80 may be filled with copper having no defects such as a dish streak therein.

Figure 3A:
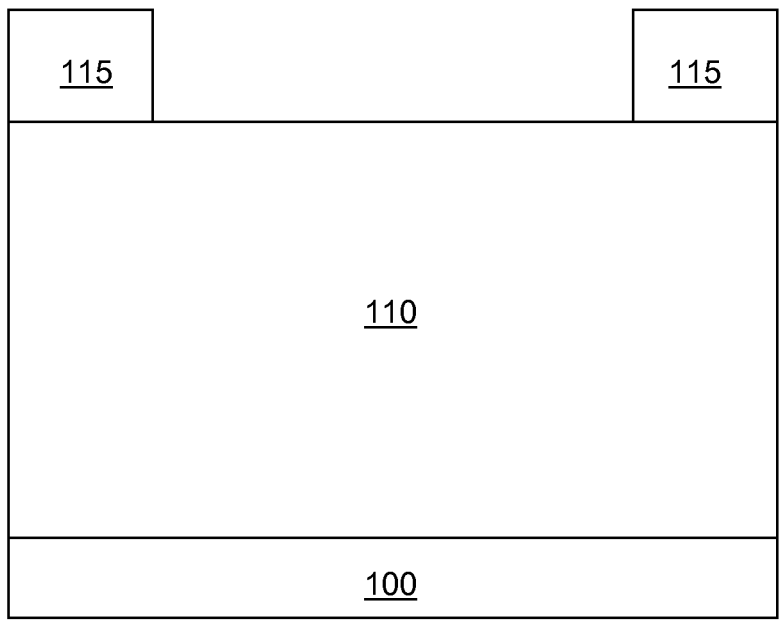
FIG. 3A-3H depicts steps of an embodiment of a method of fabricating a semiconductor device, in accordance with the present invention.

An embodiment of steps of a method of fabricating a semiconductor device according to the present invention are shown in FIGS. 3A-3H. Referring to FIG. 3A, substrate 100 comprising silicon, silicon-on-insulator, silicon germanium, or gallium arsenide is shown having a layer 110 disposed thereon. Substrate 100 may include any construction comprising semiconductor material, including but not limited to bulk semi-conductive materials such as a semiconductor wafer (either alone or in assemblies comprising other materials thereon, for example, an integrated circuit).

Additionally, substrate 100 may be a semiconductor substrate comprising but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Semiconductor substrate 100 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Layer 110 may be a dielectric layer including but not limited to a material selected from silicon oxide ($SiO_2$), silicon nitride ($Si_3N_4$), hafnium oxide ($HfO_2$), hafnium silicon oxide (HfSiO), hafnium silicon oxynitride (HfSiON), zirconium oxide ($ZrO_2$), zirconium silicon oxide (ZrSiO), zirconium silicon oxynitride (ZrSiON), aluminum oxide ($Al_2O_3$), titanium oxide ($Ti_2O_5$), tantalum oxide ($Ta_2O_5$), hydrogen silsesquioxane polymer (HSQ); methyl silsesquioxane polymer (MSQ); SiLK™ (polyphenylene oligomer) manufactured by Dow Chemical, Midland, Mich.; Black Diamond™ [$SiO_x(CH_3)_y$] manufactured by Applied Materials, Santa Clara, Calif.; fluorinated tetraethylorthosilicate (FTEOS), fluorinated silicon glass (FSG), spin on glass, and spin on polyimide.

In an embodiment, layer 110 may also comprise multiple dielectric layers, for example, a low-k (dielectric constant) layer and another dielectric layer such as silicon nitride and/or silicon oxide. The second dielectric layer may have a higher k dielectric constant value than the low-k dielectric layer. Low-k dielectric layers may include materials having a relative permittivity value of 4 or less, and examples of which include but are not limited to HSQ, MSQ, SiLK™ Black Diamond™, FTEOS, and FSG.

Layer 110 may be deposited on substrate 100 using any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

A photoresist pattern 115 corresponding to a desired wiring pattern may then be formed on layer 110. Compositions of photoresist patterns and methods of their deposition are known in the art.

Figure 3B:
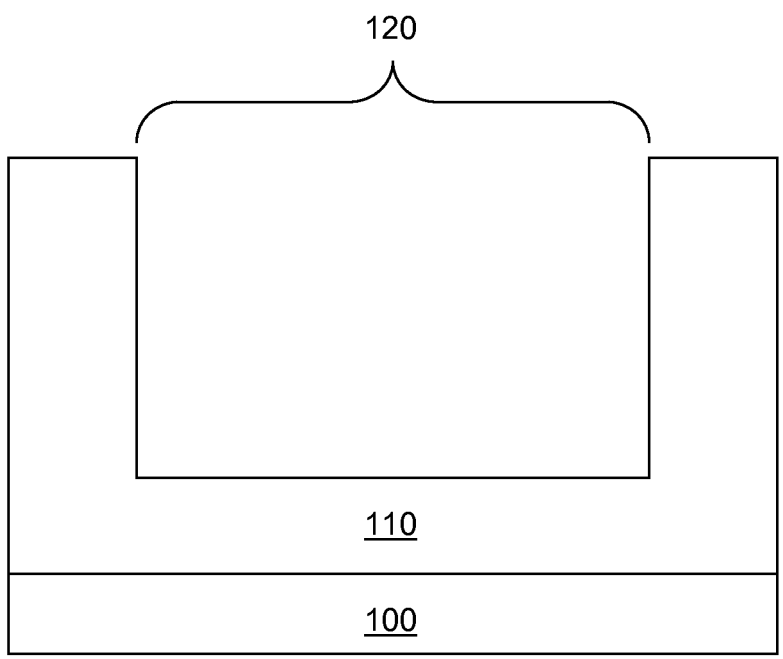

Referring to FIG. 3B, a pattern may be developed via photolithography and other techniques known in the art in layer 110 using photoresist pattern 115 as a mask. As a result, a trench 120 may be formed in layer 110 corresponding to the desired wiring pattern. A reactive ion etch may additionally be performed to further define trench 120. Trench 120 may be an example of a deep feature within a semiconductor device and in particular, a deep linear feature. Trench 120 and other deep linear features are known in the art. After trench 120 is defined, photoresist pattern 115 may be removed (not shown) by techniques known in the art.

Figure 3C:
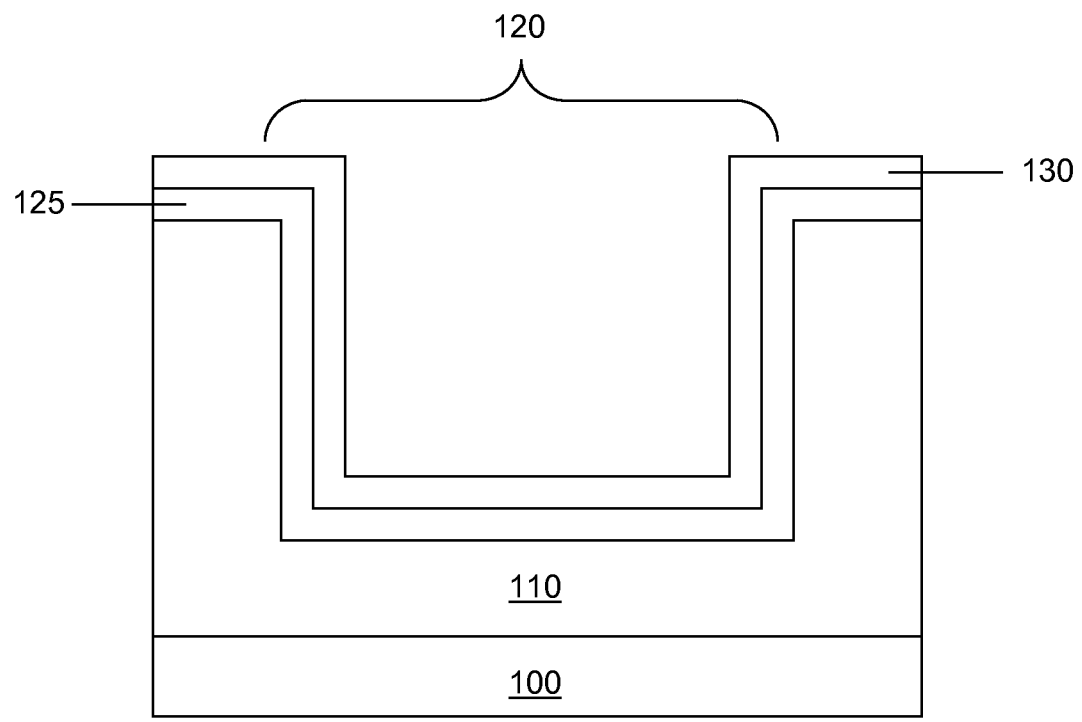

Referring to FIG. 3C, trench 120 may be conformally coated with a liner 125 and a metal seed layer 130 via physical vapor deposition and like techniques known in the art. Various embodiments of a liner and a metal seed layer have been described herein. In an embodiment, metal seed layer 130 may comprise copper.

Figure 3D:
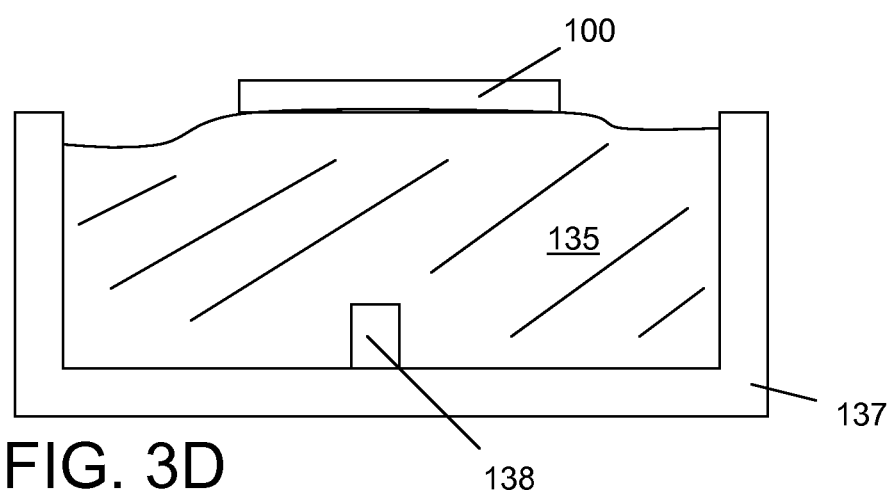
Figure 3E:
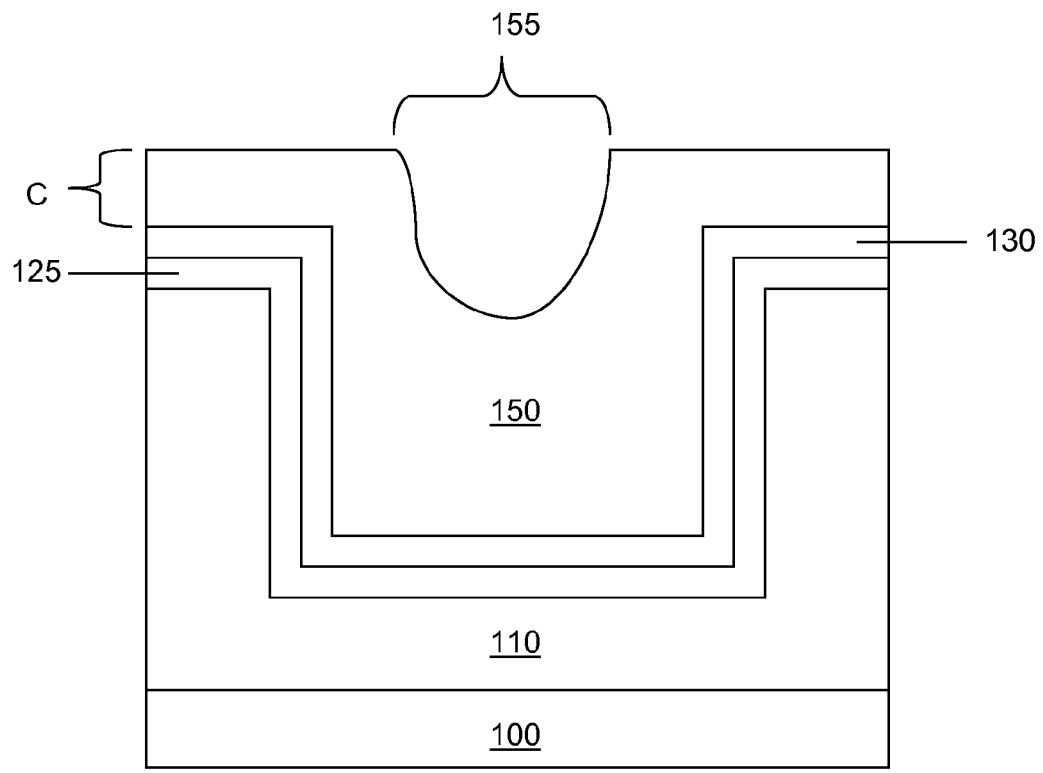

Referring to FIGS. 3D and 3E, substrate 100 may be immersed in an electrolytic plating solution 135. Various embodiments of an electrolytic plating solution and electrolytic plating parameters have been described herein. Substrate 100 may be lowered face down, e.g., trench 120 is facing solution 135, into solution 135 and rotated at a rate of approximately 30 rpm to approximately 180 rpm. Simultaneously with the rotation, a current density of approximately 3 mA/cm$^2$ to approximately 60 mA/cm$^2$ may be applied. In an embodiment, a current density of approximately 20 mA/cm$^2$ to approximately 50 mA/cm$^2$ may be applied The rotating substrate 100 may be electrically contacted at an edge of substrate 100 resulting in formation of a first metal layer 150 on the surface of substrate 100, in particular on liner 125, and within trench 120. First metal layer 150 may form on liner 125 with the aid of metal seed layer 130 and may entirely fill trench 120. An excess portion C of first metal layer 150 may also form above trench 120 and above liner 125 that is outside of trench 120. Excess portion C may have a thickness from approximately 5,000 Å to approximately 250,000 Å. A dish streak 155 may be present in first metal layer 150 and may extend into trench 120 due to localized underplating resulting from local depletion of electrolytic plating solution 135 during rotation of substrate 100. First metal layer 150 may include but is not limited to copper, nickel, gold, and/or silver. In an embodiment, first metal layer 150 may comprise copper. Devices and methods for performing electrolytic plating are known in the art.

Figure 3F:
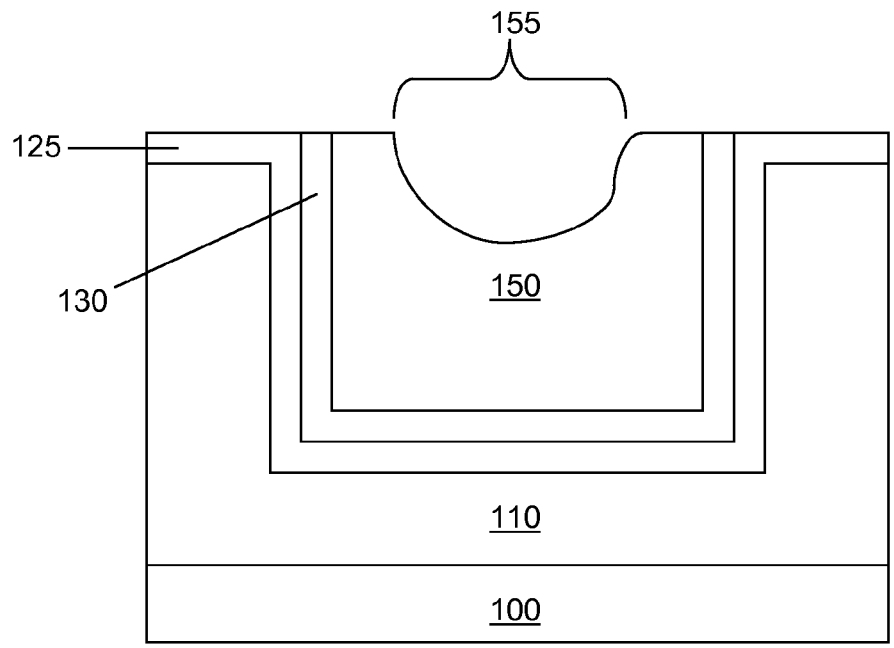

Referring to FIG. 3F, a first chemical-mechanical polishing may be performed to liner 125. First metal layer 150 may be removed down to liner 125 outside of trench 120 and above trench 120 such that first metal layer is level with liner 125 outside of trench 120. The portion of dish streak 155 extending into trench 120 may still be present after chemical-mechanical polishing. Chemical-mechanical polishing is a process known in the art. It has been discovered that performing "touch up" electrolytic plating may be used to remove dish streaking that has resulted from a previous electrolytic plating process.

Figure 3G:
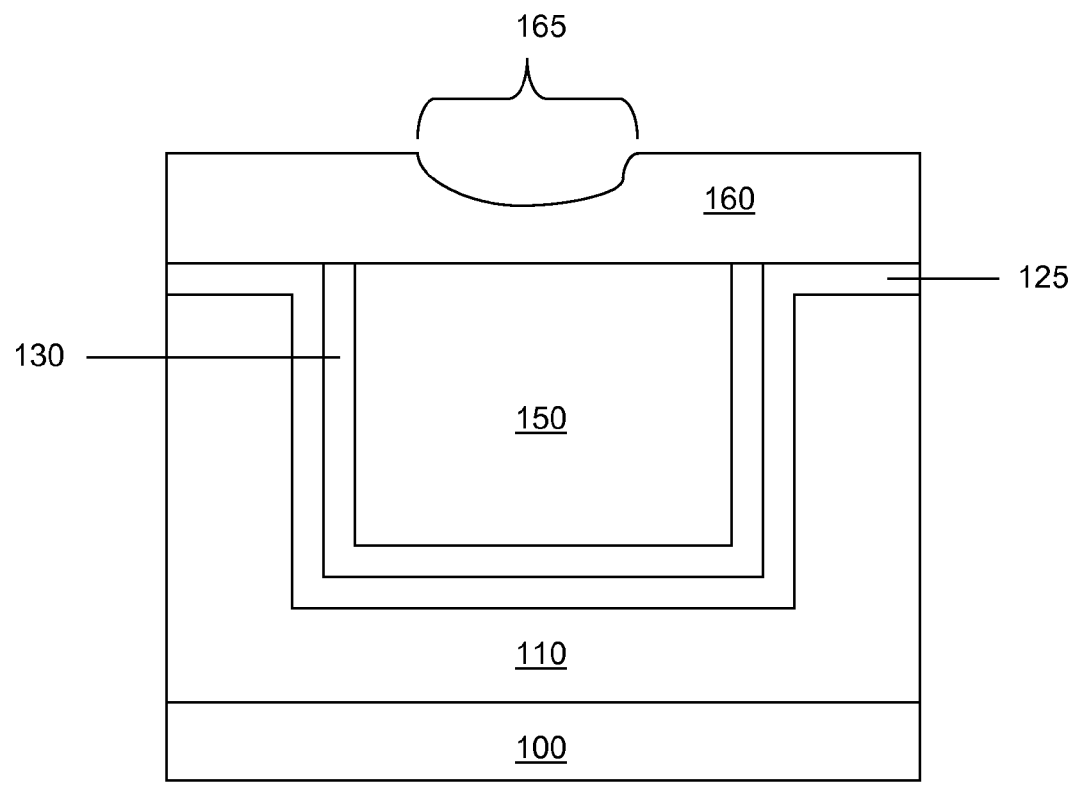

Referring to FIG. 3G, substrate 100 may be immersed again into an electrolytic plating solution (not shown) resulting in the formation of a second metal layer 160 on first metal layer 150. The electrolytic plating process for depositing second metal layer 160 may be the same as described herein for deposition of first metal layer 150, see FIG. 3D. Second metal layer 160 may include but is not limited to copper, nickel, gold, and/or silver. In an embodiment, second metal layer 160 may comprise copper. Dish streak 155 may be filled with second metal layer 160 and thus eliminated, but a dish streak 165 may be formed in second metal layer 160, again due to localized underplating resulting from local depletion of electrolytic plating solution during rotation of substrate 100. Second dish streak 165 does not extend into trench 120. The result of the second electrolytic plating step is that any defects present in first copper layer 150 may be eliminated by electrolytic plating of second copper layer 160.

Figure 3H:
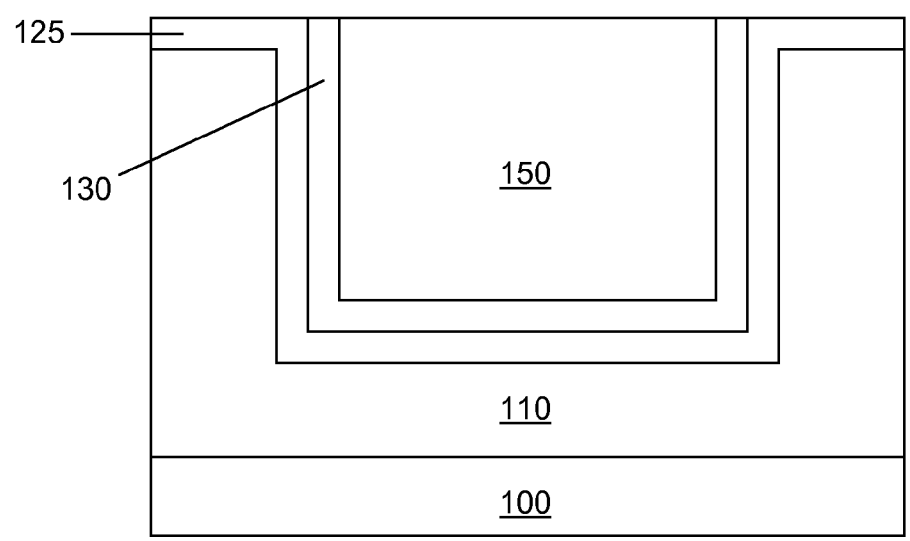

Referring to FIG. 3H, a second chemical-mechanical polishing may be performed to liner 125. Second metal layer 160 may be removed down to liner 125 outside of trench 120 and above trench 120 level with liner 125 outside of trench 120. The result is that second metal layer 160 may be removed along with second dish streak 155 leaving trench 150 filled with copper having no defects such as a dish streak.

Figure 4A:
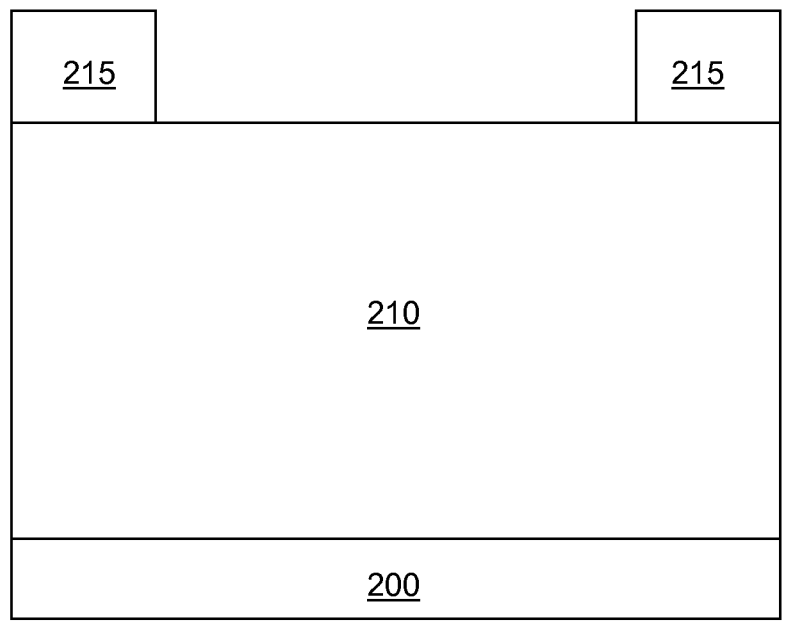
FIG. 4A-4F depicts steps of another embodiment of a method of fabricating a semiconductor device, in accordance with the present invention.

An embodiment of steps of another method of fabricating a semiconductor device according to the present invention are shown in FIGS. 4A-4F. Referring to FIG. 4A, substrate 200 is shown having a layer 210 disposed thereon. Various embodiments of a substrate and a layer deposited thereon have been described herein. A photoresist pattern 215 corresponding to a desired wiring pattern may then be formed on layer 210. Photoresist compositions and methods of their deposition are known in the art.

Figure 4B:
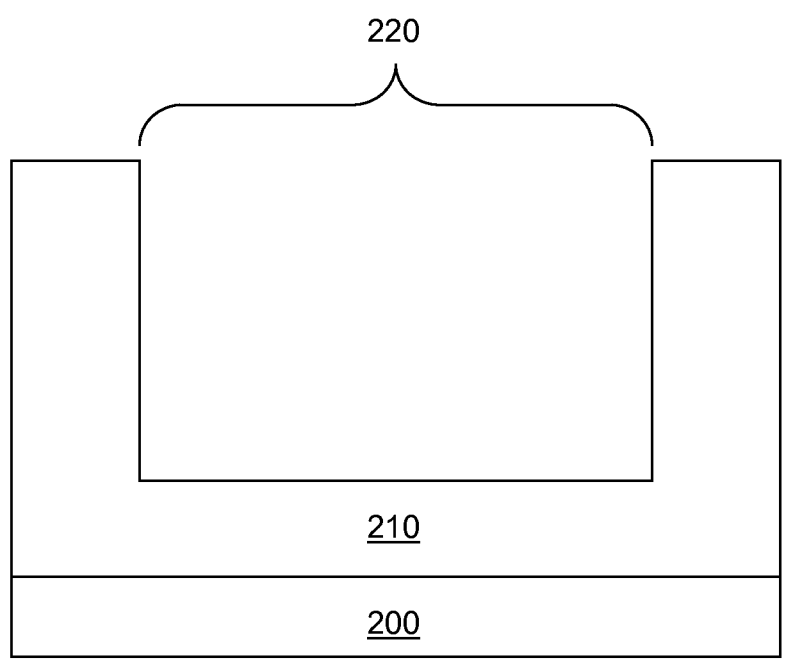

Referring to FIG. 4B, a pattern may be developed via photolithography and other known techniques in layer 210 using photoresist pattern 215 as a mask. As a result, a trench 220 may be formed within layer 210 corresponding to the desired wiring pattern defined by photoresist pattern 215. A reactive ion etch may additionally be performed to further define trench 220 and photoresist pattern 215 may then be subsequently removed by processes known in the art. Trench 220 is an example of a deep linear feature within a semiconductor device. Trench 220 and other deep features are known in the art.

Figure 4C:
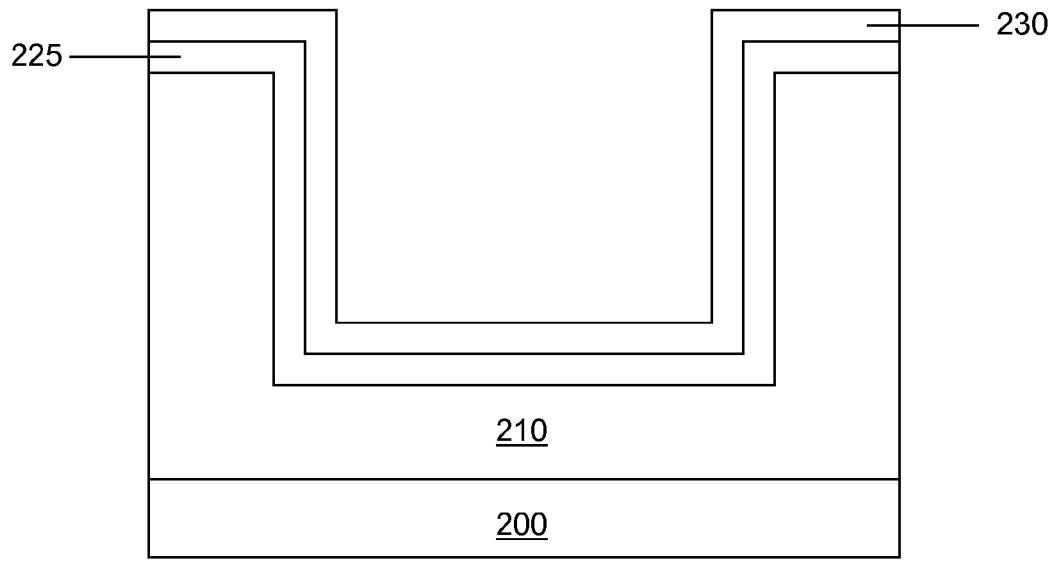

Referring to FIG. 4C, trench 220 may be conformally coated with a liner 225 and a metal seed layer 230. Various embodiments of a liner and a metal seed layer have been described herein. In one embodiment, metal seed layer 230 may comprise copper.

Figure 4D:
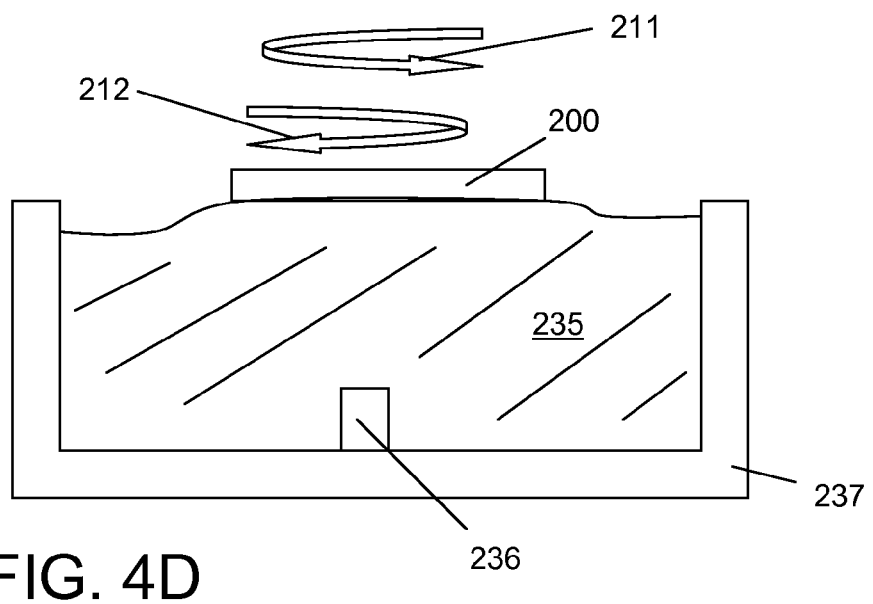
Figure 4E:
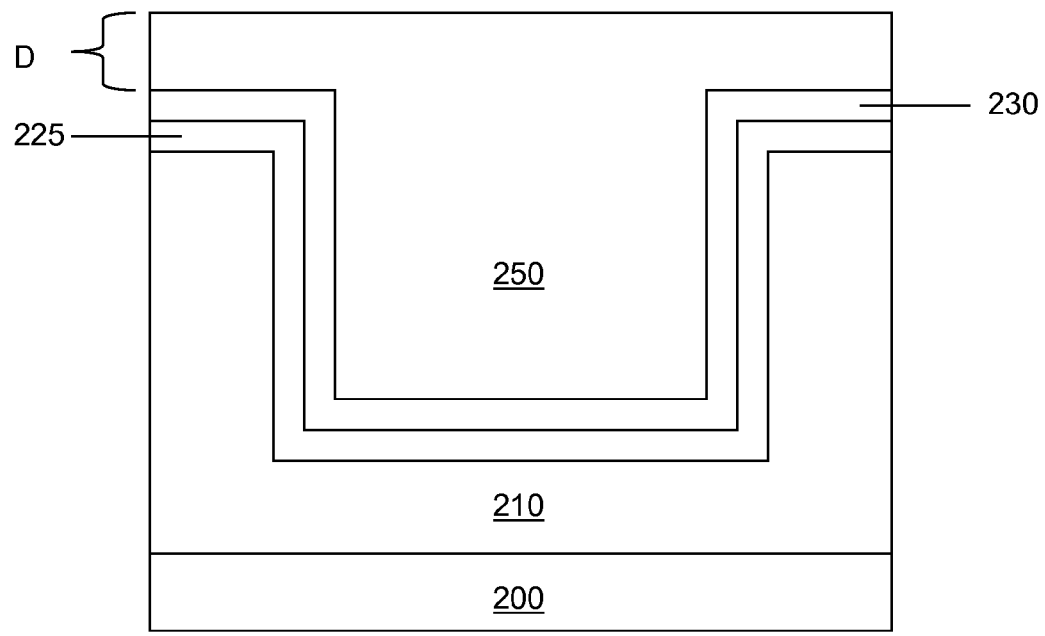

Referring to FIGS. 4D and 4E, substrate 200 may be immersed in an electrolytic plating solution 235. Various embodiments of an electrolytic plating solution and electrolytic plating parameters have been described herein. Substrate 200 may be lowered face down, e.g., trench 220 is facing solution 235, into solution 235 and may be rotated.

In an embodiment, substrate 200 may be rotated at a rate of approximately 30 rpm to approximately 180 rpm in a direction represented by directional arrow 211 for approximately 1 min to approximately 5 min. Simultaneously with the rotation, a current density of approximately 5 mA/cm$^2$ to approximately 20 mA/cm$^2$ may be applied. Then, substrate 200 may be rotated at a rate of approximately 30 rpm to approximately 180 rpm in the opposite direction represented by directional arrow 212 for approximately 1 min to approximately 5 min. Simultaneously with the rotation, a current density of approximately 5 mA/cm$^2$ to approximately 50 mA/cm$^2$ may also be applied. In embodiments of the present invention, directional arrow 211 may represent a counter-clockwise direction and directional arrow 212 may represent a clockwise direction. Rotation may be made using any now known solution; e.g., a motor.

The rotating substrate 200 may be electrically contacted at an edge of substrate 200 resulting in formation of a first metal layer 250 on the surface of substrate 200, in particular on liner 225, and within trench 220. First metal layer 250 may form on liner 225 with the aid of metal seed layer 230 and may entirely fill trench 220. An excess portion D of first metal layer 250 may also form above trench 220 and above liner 225 that is outside of trench 220. Excess portion D may have a thickness from approximately 5,000 Å to approximately 250,000 Å. Metal layer 250 may include but is not limited to copper, nickel, gold, and silver. In an embodiment, metal layer 250 may comprise copper. No defects such as dish streaking are found in metal layer 250 as underplating does not occur because rotation of substrate 200 in opposite directions prevents depletion of electrolytic plating solution 235 during the electrolytic plating process.

Figure 4F:
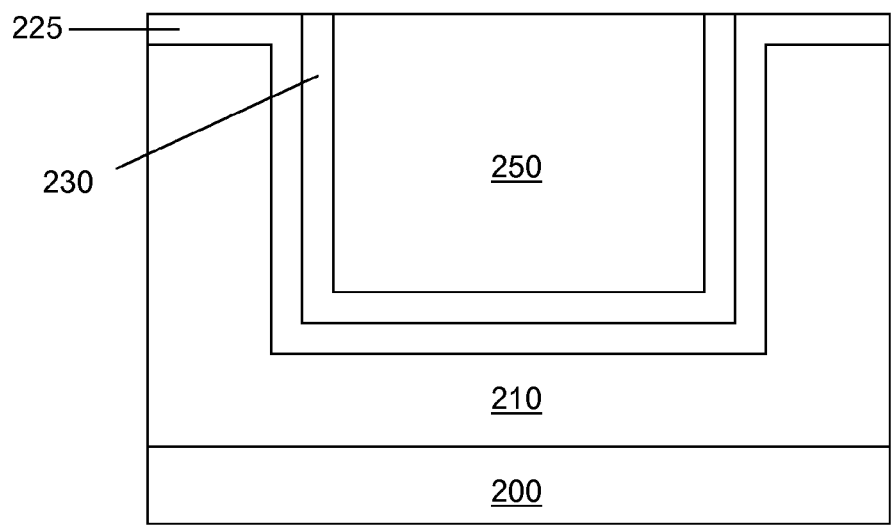

Referring to FIG. 4F, chemical-mechanical polishing may be performed to liner 225. Metal layer 250 may be removed down to liner 225 outside of trench 220 and above trench 220 such that metal layer 250 is level with liner 225 outside of trench 220. The result is that trench 220 may be filled with copper having no defects such as a dish streak therein.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "approximately" used in connection with a quantity is inclusive of the stated value and has the meaning dictated by the context, (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to approximately 25 wt %, or, more specifically, approximately 5 wt % to approximately 20 wt %", is inclusive of the endpoints and all intermediate values of the ranges of "approximately 5 wt % to approximately 25 wt %," etc).

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method of electrolytic plating comprising:
   immersing an in-process substrate into an electrolytic plating solution, the in-process substrate including:
   a dielectric layer defining a feature;
   a liner over the dielectric layer and the feature; and
   a seed layer over the liner;

rotating the in-process substrate in the electrolytic plating solution to form a first metal layer over the seed layer,
wherein the first metal layer includes an excess portion above the liner and the feature;
performing a first chemical-mechanical polish (CMP) to the first metal layer and the liner on the in-process substrate,
wherein the excess portion is removed by the first CMP and the liner is retained on the in-process substrate, and
wherein a portion of the first metal layer is retained within the feature;
immersing the in-process substrate into the electrolytic plating solution after the performing of the first CMP;
rotating the in-process substrate in the electrolytic plating solution after the performing of the first CMP and the immersing to form a second metal layer on the first metal layer,
wherein the second metal layer is formed over the liner on the in-process substrate and directly on the portion of the first metal layer retained within the feature, and
wherein the second metal layer covers the in-process substrate; and
performing a second chemical-mechanical polish (CMP) on the in-process substrate to the liner on the dielectric layer,
wherein a portion of the liner is retained outside of the feature, and
wherein the second metal layer is shaped substantially planar relative to the liner, the second metal layer and the liner forming a substantially level surface on the in-process substrate.

2. A method of electrolytic plating according to claim 1, wherein the electrolytic plating solution comprises a copper sulfate solution, a sulfuric acid solution, and a solution of organic additives.

3. A method of electrolytic plating according to claim 1, wherein the immersing includes applying a current density of approximately 3 mA/cm2 to approximately 60 mA/cm2.

4. A method of electrolytic plating according to claim 1, wherein the first metal layer comprises a metal selected from the group consisting of copper, nickel, gold, and silver.

5. A method of electrolytic plating according to claim 4, wherein the first metal layer comprises copper and substantially fills a trench formed in a surface of the in-process substrate.

6. A method of electrolytic plating according to claim 1, wherein the first metal layer includes a dish streak extending into a portion of the feature and the second metal layer covers an entire top surface of the in-process substrate.

7. A method of fabricating a semiconductor device comprising:
conformally coating a trench within a dielectric layer disposed on a substrate with a liner and a metal seed layer over the liner;
immersing the substrate into an electrolytic plating solution;
rotating the substrate in the electrolytic plating solution to form a first metal layer over the metal seed layer,
wherein the first metal layer includes an excess portion above the liner and the trench;
performing a first chemical-mechanical polish (CMP) to the first metal layer and the liner,
wherein the liner is retained on the substrate, and
wherein the excess portion is removed by the first CMP and a portion of the first metal layer is retained within the trench;
immersing the substrate into the electrolytic plating solution after the performing of the first CMP;
rotating the substrate in the electrolytic plating solution after the performing of the first CMP and the immersing to form a second metal layer directly on the portion of the first metal layer retained within the trench and over the liner on the in-process substrate,
wherein the second metal layer covers a surface of the substrate; and
performing a second chemical-mechanical polish (CMP) on the substrate,
wherein the second metal layer is leveled relative to the liner.

8. A method of fabricating a semiconductor device according to claim 7, wherein the electrolytic plating solution comprises a copper sulfate solution, a sulfuric acid solution, and a solution of organic additives.

9. A method of fabricating a semiconductor device according to claim 7, wherein the immersing includes applying a current density of approximately 3 mA/cm2 to approximately 60 mA/cm2.

10. A method of fabricating a semiconductor device according to claim 7, wherein the first metal layer comprises a metal selected from the group consisting of copper, nickel, gold, and silver.

11. A method of fabricating a semiconductor device according to claim 10, wherein the first metal layer comprises copper and substantially fills the trench.

12. A method of fabricating a semiconductor device according to claim 7, wherein the first metal layer includes a dish streak extending into a portion of the feature and the second metal layer covers a top surface of the in-process substrate.

13. A method of electrolytic plating comprising:
immersing an in-process substrate into an electrolytic plating solution, the in-process substrate including:
a dielectric layer defining a feature;
a liner over the dielectric layer; and
a seed layer over the liner;
rotating the in-process substrate in a first direction in the electrolytic plating solution to form a first metal layer over the seed layer,
wherein the first metal layer includes an excess portion above the liner and the feature;
rotating the in-process substrate in a second direction opposite the first direction in the electrolytic plating solution after the rotating in the first direction to form a second metal layer on the first metal layer,
wherein the second metal layer covers the in-process substrate; and
performing a chemical-mechanical polish (CMP) to the liner on the in-process substrate after the forming of the second metal layer,
wherein the excess portion is removed by the CMP and the second metal layer is shaped substantially planar relative to the liner, the second metal layer and the liner forming a substantially level surface on the in-process substrate.

14. A method of electrolytic plating according to claim 13, wherein the electrolytic plating solution comprises a copper sulfate solution, a sulfuric acid solution, and a solution of organic additives.

15. A method of electrolytic plating according to claim 13, wherein the immersing includes applying a current density of approximately 3 mA/cm2 to approximately 60 mA/cm2.

16. A method of electrolytic plating according to claim 13, wherein the metal layer comprises a metal selected from the group consisting of copper, nickel, gold, and silver.

17. A method of electrolytic plating according to claim 16, wherein at least one of the first metal layer and the second metal layer comprises copper and substantially fills a trench formed in a surface of the in-process substrate and wherein the second metal layer covers an entire top surface of the in-process substrate.

18. A method of electrolytic plating according to claim 13, wherein the rotating includes rotating in the first direction for approximately 1 min to approximately 5 min and rotating in the second direction for approximately 1 min to approximately 5 min.

19. A method of fabricating a semiconductor device comprising:
 conformally coating a trench within a dielectric layer disposed on a substrate with a liner and a metal seed layer over the liner,
 wherein the dielectric layer defines a feature;
 immersing the substrate into an electrolytic plating solution;
 rotating the substrate in a first direction in the electrolytic plating solution to form a first metal layer over the metal seed layer,
 wherein the first metal layer includes an excess portion above the liner and the feature;
 rotating the substrate in a second direction opposite the first direction in the electrolytic plating solution after the rotating in the first direction to form a second metal layer directly on the first metal layer,
 wherein the second metal layer covers a surface of the substrate; and
 performing a chemical-mechanical polish (CMP) to the liner after the forming of the second metal layer,
 wherein the excess portion is removed by the CMP and the liner is retained on the substrate, and
 wherein the second metal layer is leveled relative to the liner.

20. A method of fabricating a semiconductor device according to claim 19, wherein the electrolytic plating solution comprises a copper sulfate solution, a sulfuric acid solution, and a solution of organic additives.

21. A method of fabricating a semiconductor device according to claim 19, wherein the immersing includes applying a current density of approximately 3 mA/cm2 to approximately 60 mA/cm2.

22. A method of fabricating a semiconductor device according to claim 19, wherein the metal layer comprises a metal selected from the group consisting of copper, nickel, gold, and silver.

23. A method of fabricating a semiconductor device according to claim 22, wherein the metal layer comprises copper and substantially fills the trench.

24. A method of fabricating a semiconductor device according to claim 19, wherein the rotating includes rotating in the first direction for approximately 1 min to approximately 5 min and rotating in the second direction for approximately 1 min to approximately 5 min.

25. A method of fabricating a semiconductor device according to claim 19, wherein the first direction is opposite to the second direction, and
 wherein the second metal layer covers an entire top surface of the in-process substrate.

* * * * *